(12) United States Patent
Ishino et al.

(10) Patent No.: US 12,278,170 B2
(45) Date of Patent: Apr. 15, 2025

(54) SEMICONDUCTOR MODULE, ELECTRICAL COMPONENT, AND CONNECTION STRUCTURE OF THE SEMICONDUCTOR MODULE AND THE ELECTRICAL COMPONENT

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Hiroshi Ishino, Nisshin (JP); Hirokazu Sampei, Nisshin (JP); Katsuya Kumagai, Nisshin (JP); Koji Doi, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 500 days.

(21) Appl. No.: 17/846,371

(22) Filed: Jun. 22, 2022

(65) Prior Publication Data

US 2022/0415765 A1   Dec. 29, 2022

(30) Foreign Application Priority Data

Jun. 23, 2021   (JP) ................. 2021-104329

(51) Int. Cl.
*H01L 23/495* (2006.01)
*H01L 23/31* (2006.01)

(52) U.S. Cl.
CPC .... *H01L 23/49575* (2013.01); *H01L 23/3107* (2013.01); *H01L 23/49548* (2013.01)

(58) Field of Classification Search
CPC ............ H02M 7/003; H01L 23/49575; H01L 23/3107; H01L 23/49548; H01L 2924/18
See application file for complete search history.

(56) References Cited

U.S. PATENT DOCUMENTS

| 10,090,774 | B1 | 10/2018 | Beckedahl et al. |
| 2015/0131232 | A1* | 5/2015 | Ishino ............ H05K 1/185 361/707 |
| 2015/0214205 | A1 | 7/2015 | Tokuyama et al. |

FOREIGN PATENT DOCUMENTS

| JP | H07-045450 A | 2/1995 |
| JP | 2001-210392 A | 8/2001 |
| JP | 2006-050769 A | 2/2006 |

* cited by examiner

*Primary Examiner* — John A Bodnar
(74) *Attorney, Agent, or Firm* — Posz Law Group, PLC (57) ABSTRACT

A semiconductor module includes a resin molded part encapsulating a semiconductor chip, a first terminal having a plate shape, and a second terminal having a plate shape. The first terminal and the second terminal are disposed on top of the other in a thickness direction. The first terminal is exposed from a first surface of the resin molded part, and the second terminal is projected from a second surface of the resin molded part to an outside of the resin molded part, the second surface being different from the first surface from which the first terminal is exposed.

12 Claims, 11 Drawing Sheets

SEMICONDUCTOR MODULE, ELECTRICAL COMPONENT, AND CONNECTION STRUCTURE OF THE SEMICONDUCTOR MODULE AND THE ELECTRICAL COMPONENT

CROSS REFERENCE TO RELATED APPLICATION

The present application claims the benefit of priority from Japanese Patent Application No. 2021-104329 filed on Jun. 23, 2021. The entire disclosures of the above application are incorporated herein by reference.

TECHNICAL FIELD

The present disclosure relates to a semiconductor module, an electrical component, and a connection structure of the semiconductor module and the electrical component.

BACKGROUND

It has been required to reduce wiring inductance in a connection structure between a semiconductor module constituting a three-phase inverter circuit and a capacitor module including a smoothing capacitor.

SUMMARY

The present disclosure provides a semiconductor module, an electrical component, and a connection structure of the semiconductor module and the electrical component, which are capable of which are capable of easily securing insulation while reducing the inductance. A semiconductor module according to an aspect may include a resin molded part encapsulating a semiconductor chip therein, a first terminal having a plate shape and a second terminal having a plate shape. The first terminal and the second terminal are disposed to overlap with each other. The first terminal is exposed from a first surface of the resin molded part. The second terminal projects from a second surface of the resin molded part, the second surface being different from the first surface from which the first terminal exposes. An electrical component according to an aspect includes a housing, a third terminal having a plate shape, and a fourth terminal having a plate shape. The third terminal and the fourth terminal are disposed to overlap with each other and projected from the housing in an overlapped state. The third terminal is provided with a first bolt on a surface opposite to the fourth terminal. The fourth terminal is provided with a second bolt on a surface opposite to the third terminal.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

To begin with, a relevant technology will be described only for understanding the embodiments of the present disclosure.

For example, there is a semiconductor module that has two terminals connected to semiconductor chips of upper and lower arms. The two terminals are disposed to overlap with each other in a thickness direction and projected from a resin molded part in an overlapped state. Also, there is a capacitor module in which two terminals connected to a smoothing capacitor are disposed to overlap with each other in a thickness direction and projected from a housing in an overlapped state. The two terminals are disposed on top of the other in such a way so as to reduce the wiring inductance.

In each of the semiconductor module and the capacitor module, the two terminals have different projection lengths. Specifically, in the semiconductor module, a P terminal, which is connected to a positive electrode of a power supply via the capacitor module, has a longer projection length than an N terminal, which is connected to a negative electrode of the power supply. Further, an insulating paper is arranged between the P terminal and the N terminal so as to cover the N terminal. In the capacitor module, the P terminal has a shorter projection length than the N terminal, and an insulating paper is arranged between the P terminal and the N terminal so as to cover the P terminal.

In the connection structure of the semiconductor module and the capacitor module, the two terminals of the semiconductor module and the two terminals of the capacitor module are arranged to face each other, so that the P terminals are in contact with each other, and the N terminals are in contact with each other.

In such a terminal structure of the semiconductor module and a terminal structure of the capacitor module, it is difficult to secure insulation between two terminals having different potentials. That is, in the semiconductor module, since the length of the portion of the insulating paper protruding from the N terminal defines a creepage distance between the P terminal and the N terminal, an increase in the creepage distance results in an increase in the size of the connection structure. Similarly, in the capacitor module, an increase in creepage distance results in an increase in the size of the connection structure.

The present disclosure provides a semiconductor module, an electrical component, and a connection structure of the semiconductor module and the electrical component, which are capable of easily securing insulation while reducing the inductance.

According to an aspect of the present disclosure, a semiconductor module includes a resin molded part encapsulating a semiconductor chip therein, a first terminal having a plate shape and a second terminal having a plate shape. The first terminal and the second terminal are disposed to overlap with each other in a thickness direction of the first terminal and the second terminal. The first terminal is exposed from a first surface of the resin molded part. The second terminal projects from a second surface of the resin molded part, the second surface being different from the first surface from which the first terminal exposes.

In such a configuration, since the first terminal and the second terminal are disposed to overlap with each other, the wiring inductance can be reduced. Further, since the first terminal is exposed from the first surface of the resin molded part different from the second surface from which the second terminal projects, it is easy to secure the insulation distance of the first terminal and the second terminal, for example, as compared with a configuration in which the first terminal and the second terminals are projected from the same surface.

According to a second aspect of the present disclosure, an electrical component includes a housing, a third terminal having a plate shape, and a fourth terminal having a plate shape. The third terminal and the fourth terminal are disposed to overlap with each other in a thickness direction of the third terminal and the fourth terminal and projected from the housing in an overlapped state. The third terminal is provided with a first bolt on a surface opposite to the fourth terminal. The fourth terminal is provided with a second bolt on a surface opposite to the third terminal.

In such a configuration, since the third terminal and the fourth terminal are disposed to overlap with each other, the wiring inductance can be reduced. Further, the third terminal and the fourth terminal have the first bolt and the second bolt, respectively. When the electrical component is connected to the semiconductor module, the first and second terminals of the semiconductor module can be slid relative to the third terminal and the fourth terminal. Namely, the semiconductor module and the electrical component can be easily connected to each other, as well as the insulation between the semiconductor module and the electrical component can be easily secured.

Hereinafter, embodiments of the present disclosure will be described with reference to the drawings. In the embodiments described hereinafter, the same or equivalent parts are designated with the same reference numbers.

First Embodiment

A first embodiment of the present disclosure will be described. The present embodiment includes a semiconductor module provided with a three-phase inverter circuit for driving a three-phase AC motor and a capacitor module provided with a smoothing capacitor connected to the three-phase inverter circuit.

Figure 1:
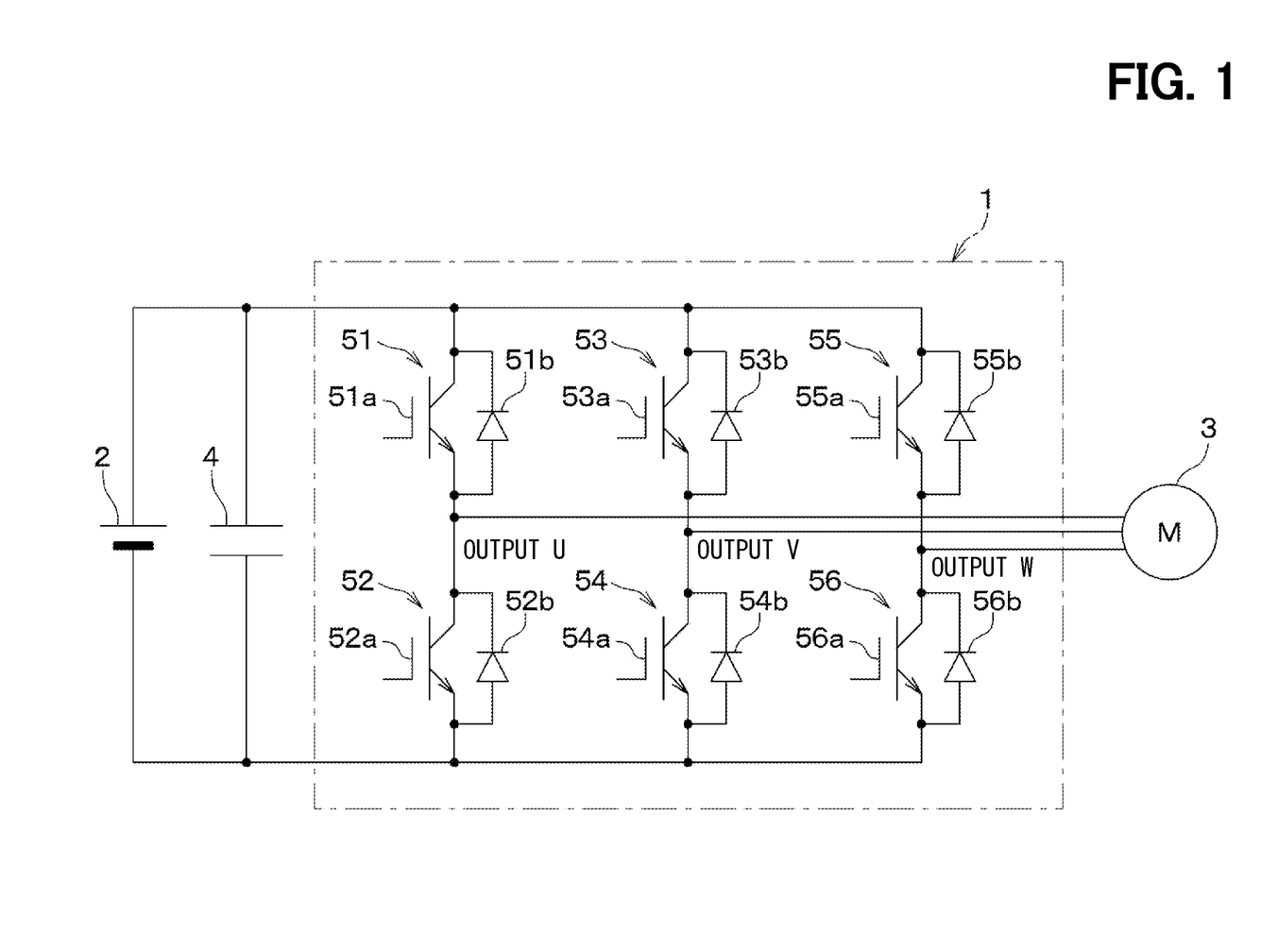
FIG. 1 is a circuit diagram of a three-phase inverter circuit according to a first embodiment of the present disclosure.

As shown in FIG. 1, the three-phase inverter circuit 1 is for driving a load 3, which is a three-phase AC motor, based on a DC power supply 2. A smoothing capacitor 4 is connected in parallel to the three-phase inverter circuit 1, and is configured to reduce ripples during switching and suppress the influence of noise, thereby to generate a constant power supply voltage.

The three-phase inverter circuit 1 has upper-lower arm circuits connected in parallel for three phases, each upper-lower arm circuit including an upper arm 51, 53, 55 and a lower arm 52, 54, 56 connected in series. The three-phase inverter circuit 1 alternately and sequentially applies intermediate potentials between the upper arms 51, 53, 55 and the lower arms 52, 54, 56 to U-phase, V-phase, and W-phase of the three-phase AC motor as the load 3.

Specifically, the upper and lower arms 51 to 56 include semiconductor switching elements 51a to 56a such as IGBTs and MOSFETs, and rectifying elements 51b to 56b for reflowing such as FWD, respectively. As the semiconductor switching elements 51a to 56a of the upper and lower arms 51 to 56 of the respective phases are controlled to be turned on and off, three-phase alternating currents having different cycles are supplied to the three-phase AC motor. In this way, the three-phase AC motor is driven. Here, IGBT is an abbreviation for Insulated Gate Bipolar Transistor. MOSFET is an abbreviation for Metal-Oxide-Semiconductor Field-Effect Transistor. FWD is an abbreviation for Free Wheeling Diode.

In the present embodiment, the semiconductor chips formed with the semiconductor switching elements 51a to 56a and the rectifying elements 51b to 56b for constituting the three-phase inverter circuit 1 are modularized and integrated. That is, the three-phase inverter circuit 1 is configured as a semiconductor module having a 6-in-1 structure in which six arms are integrated.

Structures of the semiconductor module will be described in detail. A semiconductor module 6 shown in FIGS. 2 to 7 includes semiconductor chips 10, lead frames 11 and 12, output terminals 13, control terminals 14, connection terminals 15 and 16, and heat dissipation plates 17 and 18. These components of the semiconductor module 6 are encapsulated by a rectangular plate-shaped resin molded part 19.

Figure 2:
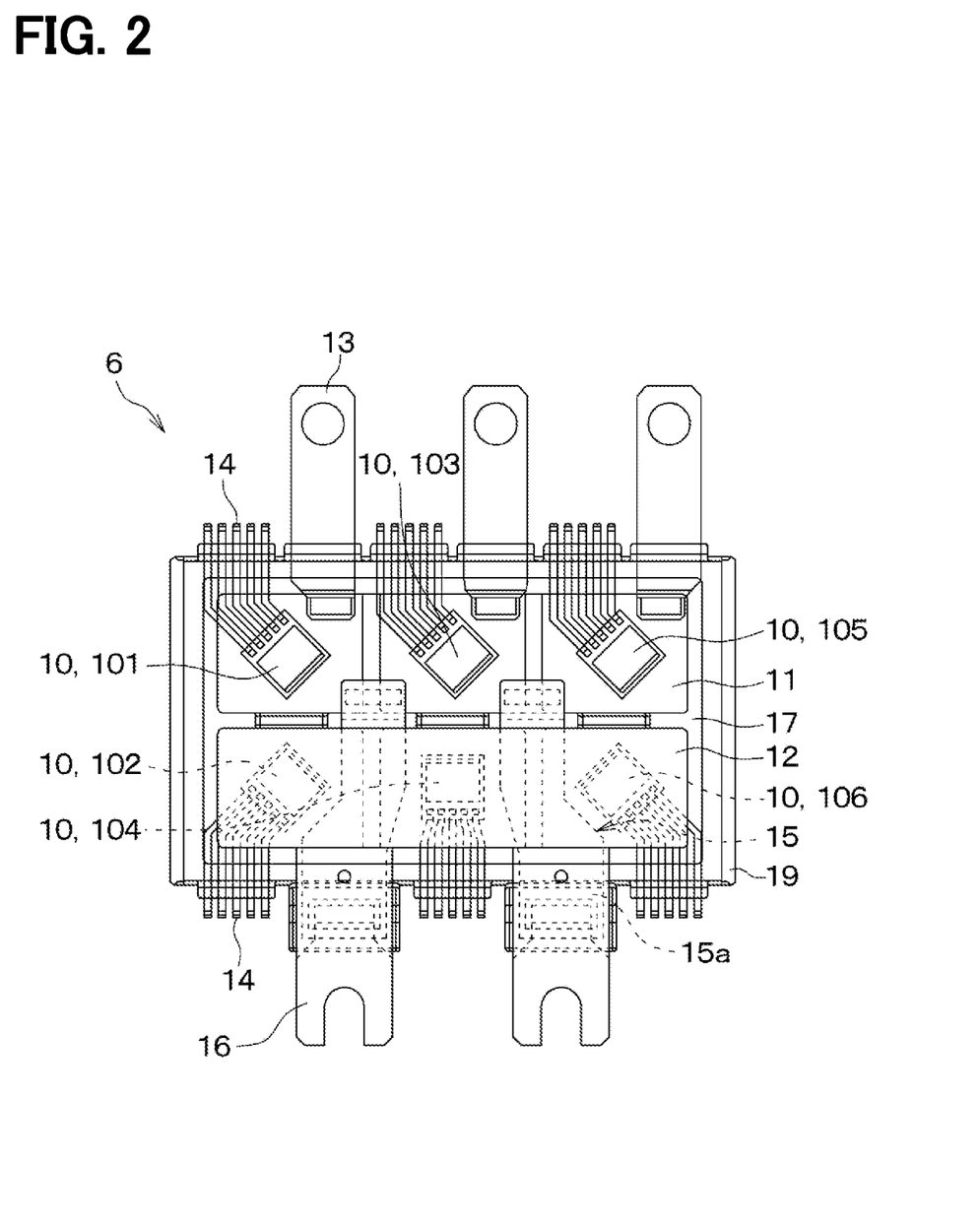
FIG. 2 is a diagram showing an internal structure of a semiconductor module according to the first embodiment of the present disclosure.
Figure 3:
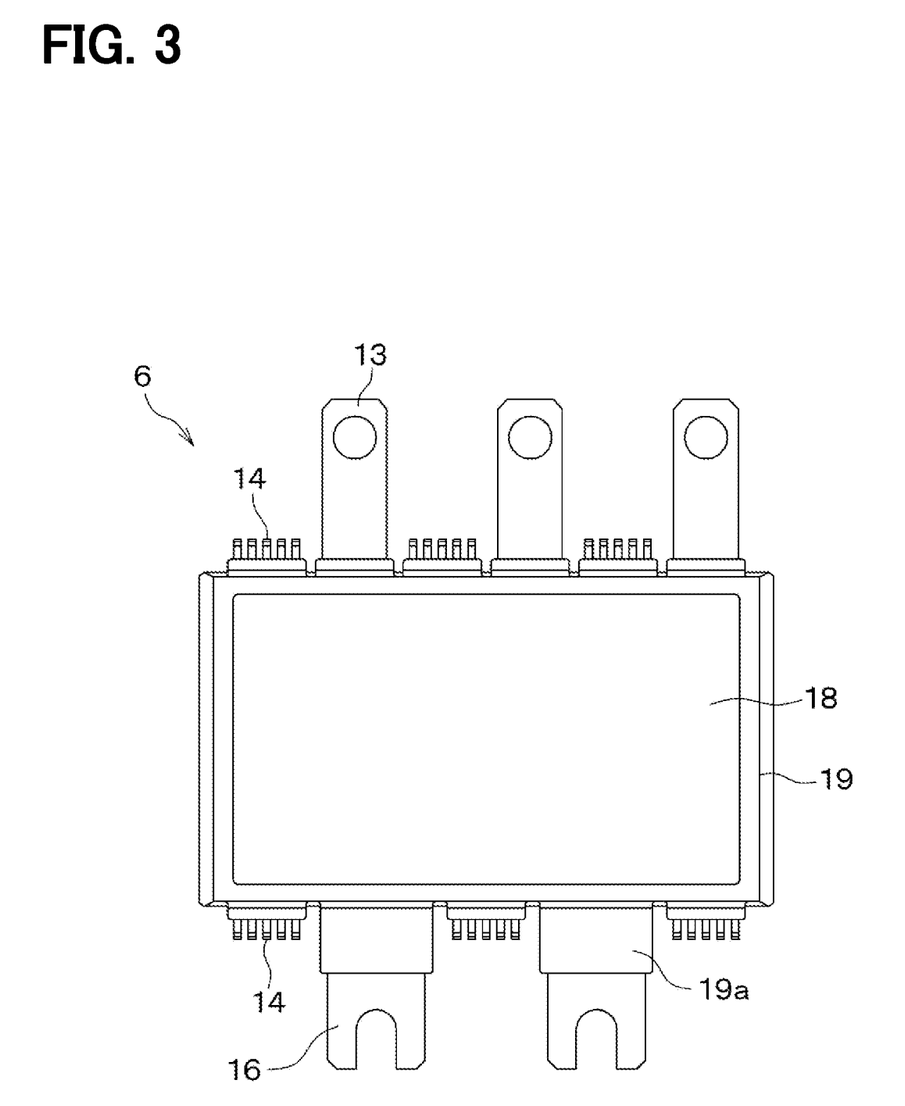
FIG. 3 is a top view of the semiconductor module.

In the semiconductor module 6, six semiconductor chips 10 are provided corresponding to the upper and lower arms 51 to 56. The semiconductor chips 10 constituting the upper and lower arms 51 to 56 are referred to as semiconductor chips 101 to 106, respectively.

As shown in FIG. 2, the six semiconductor chips 10 are arranged in three rows. Specifically, the semiconductor chips 101, 103 and 105 constituting the upper arms 51, 53 and 55 are aligned in the order of the semiconductor chips 101, 103 and 105 along one direction parallel to an upper surface of the resin molded part 19. The semiconductor chips 102, 104, and 106 are aligned in the order of the semiconductor chips 102, 104, and 106 along the one direction, that is, an alignment direction of the semiconductor chips 101, 103, and 105.

The semiconductor chips 101, 103 and 105 of the upper arms are mounted on the front surface side of the lead frame 11, and the semiconductor chips 102, 104 and 106 of the lower arms are mounted on the back surface side of the lead frame 12. The semiconductor chips 101, 103, and 105 are connected to the output terminals 13 via the lead frame 11. The semiconductor chips 102, 104, and 106 are connected to the output terminals 13 via the lead frame 12, a wiring layer (not shown), and the lead frame 11.

The semiconductor module 6 includes three output terminals 13. The three output terminals 13 are connected to the U phase, V phase, and W phase of the load 3, respectively.

Each of the output terminals 13 is made of a plate-shaped conductive member and projects from a side surface of the resin molded part 19.

Each of the semiconductor chips 10 is connected to the control terminals 14. The control terminal 14 is provided by a rod-shaped conductive member. One end of the control terminal 14 is connected to the semiconductor chip 10 and the other end of the control terminal 14 projects from the side surface of the resin molded part 19. The portion of the control terminal 14 exposed from the resin molded part 19 has a bend so as to project toward the upper surface side of the resin molded part 19.

The control terminals 14 are provided for each semiconductor chip 10. The control terminals 14 corresponding to the semiconductor chips 101, 103 and 105 of the upper arms project from the same side surface of the resin molded part 19 as the output terminals 13. The control terminals 14 corresponding to the semiconductor chips 102, 104 and 106 of the lower arms project from a side surface of the resin molded part 19 on the side opposite to the output terminals 13.

The connection terminals 15 and 16 are terminals for connecting the semiconductor chips 10 to a capacitor module 7, which will be described later. The connection terminals 15 and 16 each have a plate shape. The connection terminals 15 and 16 are disposed on top of the other, that is, disposed to overlap with each other in a thickness direction of the connection terminals 15 and 16, and projected from the side surface of the resin molded part 19 in an overlapped state. Note that the connection terminals 15 and 16 are spaced from each other and are electrically insulated from each other. The thickness direction will be also referred to as an overlapping direction, and will correspond to a direction normal to the surface of the connection terminals 15 and 16.

The connection terminal 15 is a terminal for connecting the semiconductor chips 101, 103, and 105 to the positive electrode of the DC power supply 2 via the capacitor module 7. The connection terminal 16 is a terminal for connecting the semiconductor chips 102, 104, and 106 to the negative electrode of the DC power supply 2 via the capacitor module 7. The connection terminal 15 corresponds to a first terminal, and the connection terminal 16 corresponds to a second terminal.

The connection terminal 15 includes an internal terminal 15a encapsulated in the resin molded part 19 and an external terminal 15b arranged outside the resin molded part 19. The internal terminal 15a is provided by a plate-shaped conductive member. The internal terminal 15a is connected to the semiconductor chips 101, 103, and 105 of the upper arms via the lead frame 11.

The semiconductor module 6 has two connection terminals 15. The two connection terminals 15 are arranged on opposite sides of the semiconductor chips 103 and 104 in a central row, among the six semiconductor chips 10 arranged in the three rows. In other words, the two connection terminals 15 are arranged to interpose the semiconductor chips 103 and 104 in the central row therebetween with respect to the alignment direction of the semiconductor chips 101, 103 and 105. Specifically, the internal terminal 15a of one of the two connection terminals 15 is arranged so as to pass between the semiconductor chips 101 and 103 of the upper arms and between the semiconductor chips 102 and 104 of the lower arms. The internal terminal 15a of the other one of the two connection terminals 15 is arranged so as to pass between the semiconductor chips 103 and 105 of the upper arms and between the semiconductor chips 104 and 106 of the lower arms.

Figure 4:
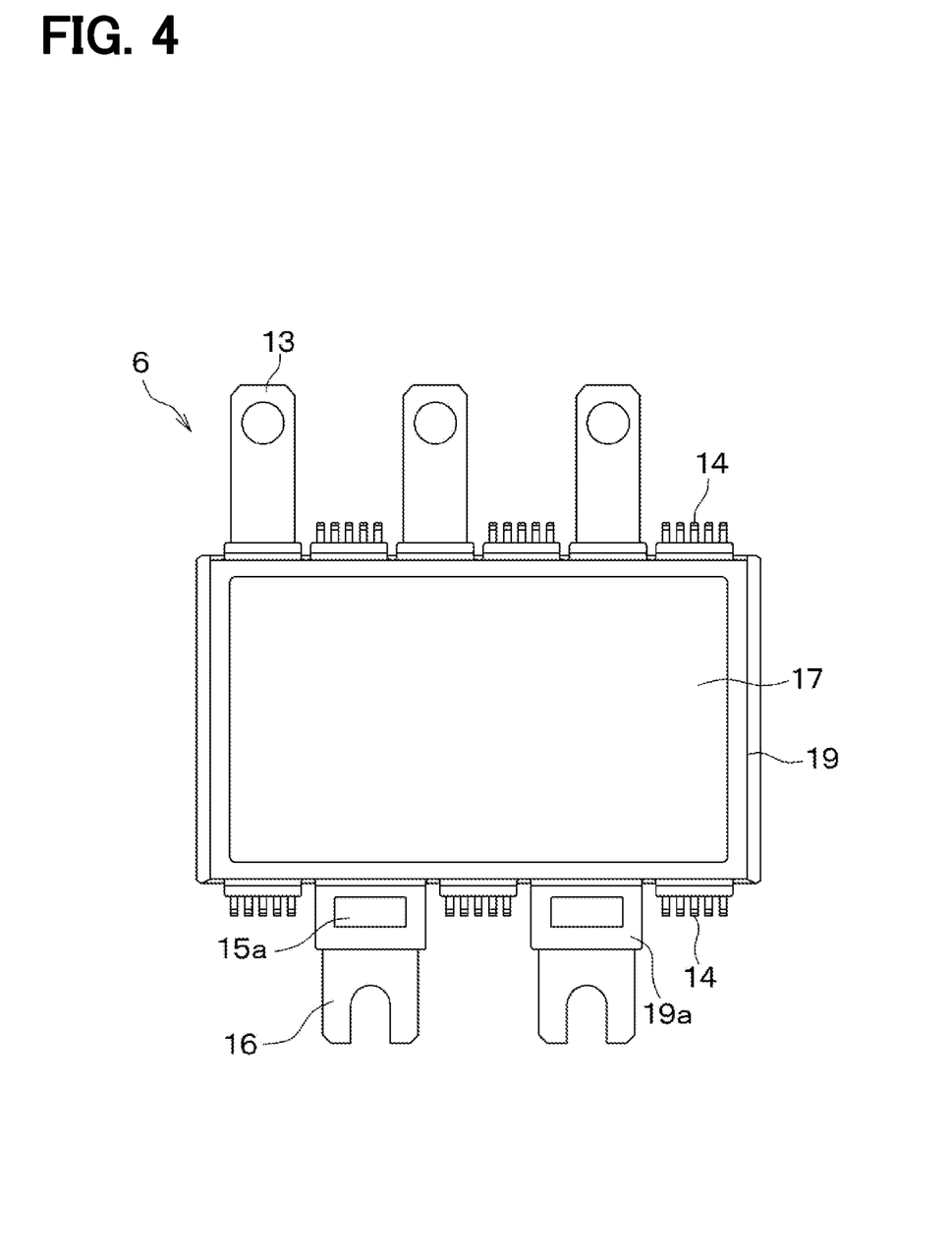
FIG. 4 is a bottom view of the semiconductor module before external terminals are joined thereto.
Figure 5:
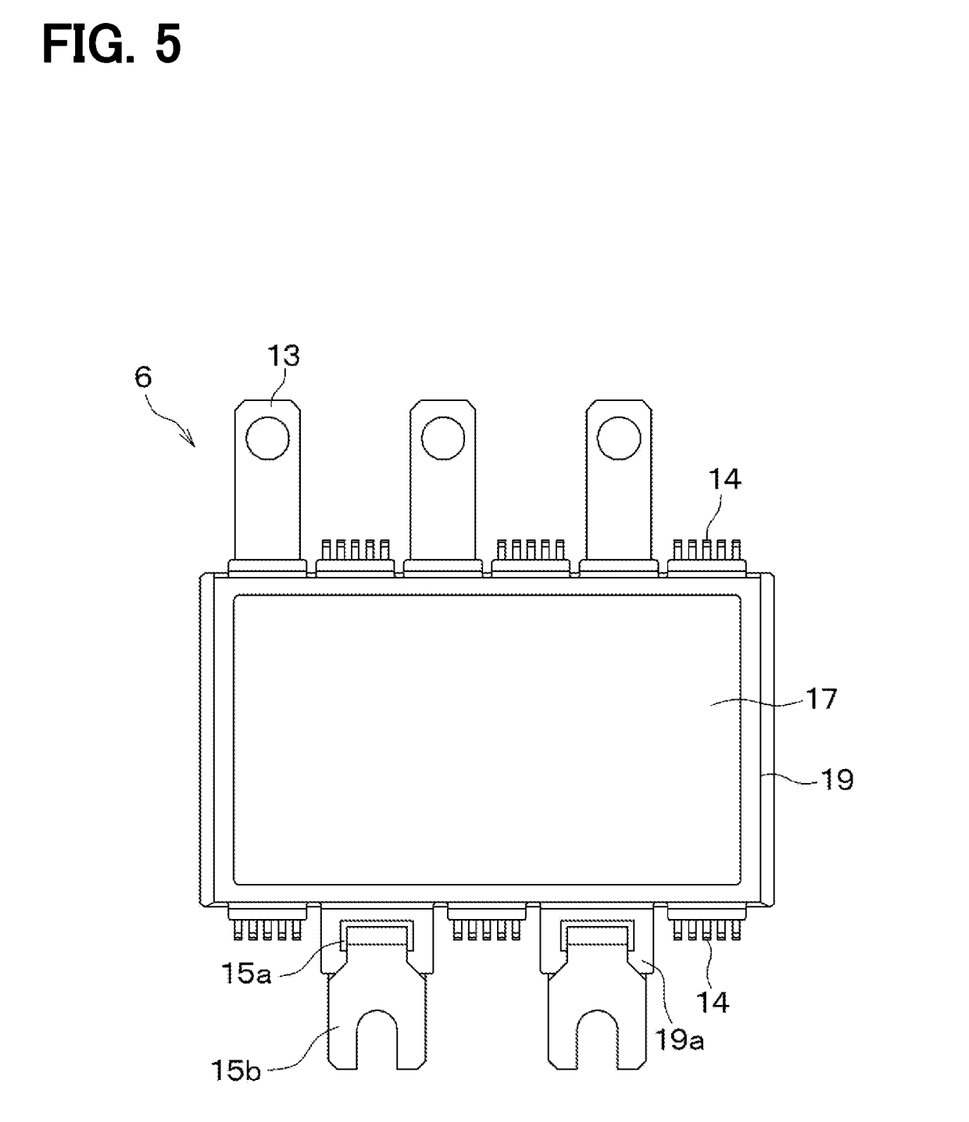
FIG. 5 is a bottom view of the semiconductor module after the external terminals are joined thereto.
Figure 7:
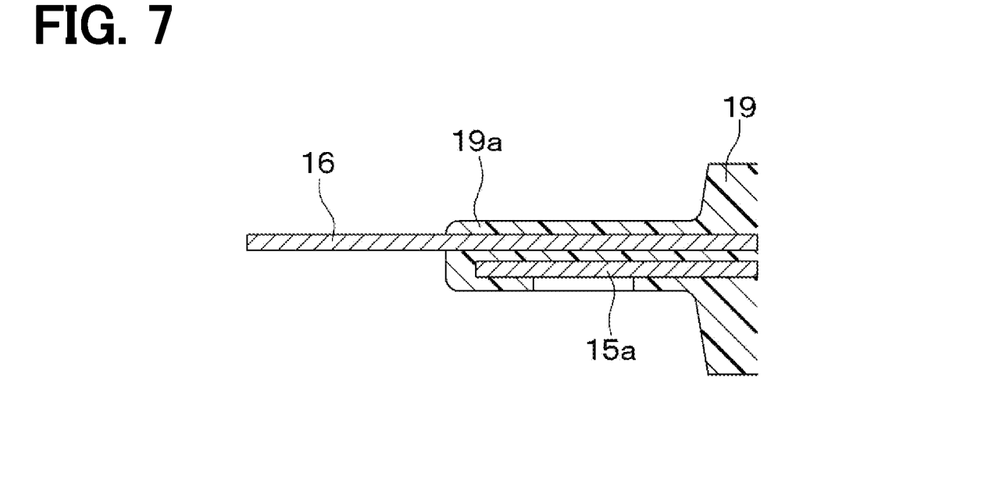
FIG. 7 is a cross-sectional view of a part of the semiconductor module around connection terminals.

One end of the internal terminal 15a in a longitudinal direction of the internal terminal 15a is connected to the semiconductor chips 101, 103, 105, and the other end of the internal terminal 15a projects from the side surface of the resin molded part 19 on the opposite side to the output terminals 13. As shown in FIGS. 3 to 7, the resin molded part 19 is formed with a rectangular plate-shaped projected portion 19a on the side surface from which the control terminals 14 of the lower arm project. The portion of the internal terminal 15a that projects from the side surface of the resin molded part 19 is covered with the projected portion 19a and is partly exposed from an opening formed on a bottom surface of the projected portion 19a, as shown in FIGS. 4 and 7. The exposed portion of the internal terminal 15a is joined to the external terminal 15b, as shown in FIG. 5, by ultrasonic bonding, brazing, or the like.

Figure 6:
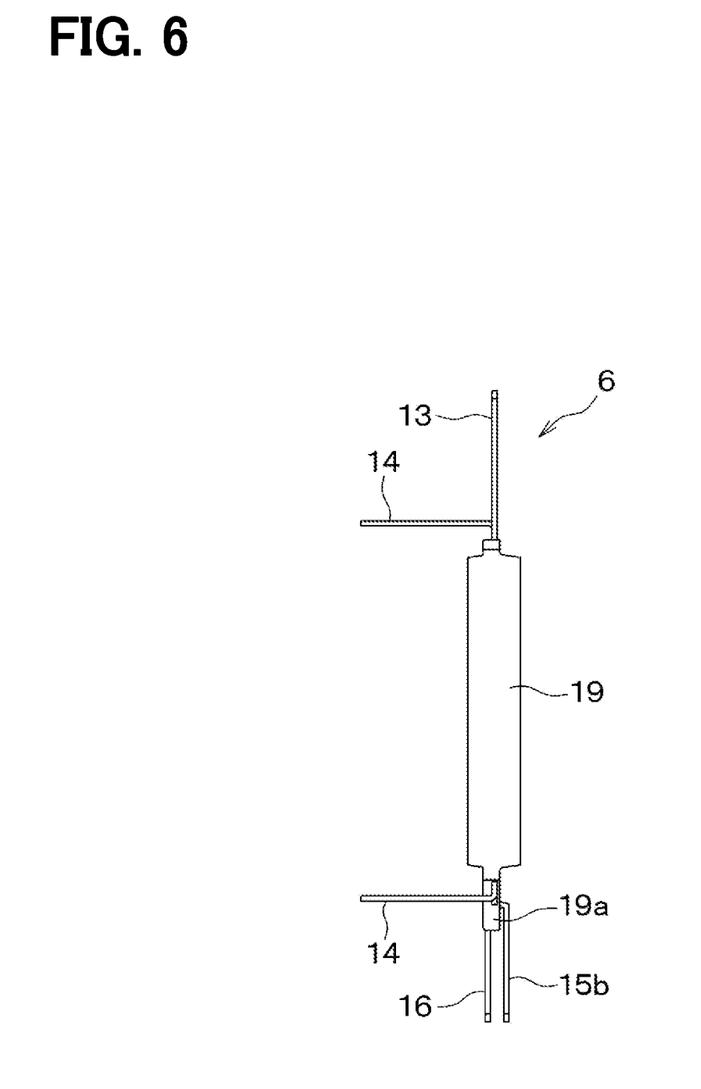
FIG. 6 is a side view of the semiconductor module.

The external terminal 15b is provided by a plate-shaped conductive member and is bent so as to have a crank shape when viewed from the side, as shown in FIG. 6. One end of the external terminal 15b, which is on one side of the bent portion, is connected to the internal terminal 15a, and the other end of the external terminal 15b, which on the other side of the bent portion, is projected outside of the projected portion 19a. The other end of the external terminal 15b is extended along the bottom surface of the projected portion 19a with spaced from the surface of the projected portion 19a. The distance between the other end of the external terminal 15b and the projected portion 19a is 0.1 mm or more and 2 mm or less in order to suppress biting of foreign matters. The other end of the external terminal 15b is connected to the capacitor module 7.

The connection terminal 16 is provided by a plate-shaped conductive member. The connection terminal 16 is connected to the semiconductor chips 10 of the lower arms via the lead frame 12. One end of the connection terminal 16 in a longitudinal direction of the connection terminal 16 is connected to the semiconductor chip 102, 104, 106 of the lower arm, and the other end of the connection terminal 16 is projected from the side surface of the resin molded part 19 on the opposite side from the output terminals 13. The other end of the connection terminal 16 is projected from a tip end surface of the projected portion 19a. The other end of the connection terminal 16 is projected in the same direction as the external terminals 15b. The base of the connection terminal 16 is covered with the projected portion 19a. The connection terminal 16 is connected to the capacitor module 7 at the portion exposed from the projected portion 19a.

The semiconductor module 6 includes two connection terminals 16. Also, as described above, the semiconductor module 6 includes the two connection terminals 15. As shown in FIG. 2, each of the two internal terminals 15a is layered with a corresponding one of the two connection terminals 16 and the lead frame 12 in a region covered with the resin molded parts 19.

The internal terminal 15a is exposed on a surface of the resin molded part 19 different from the surface of the rein molded part 19 from which the connection terminal 16 projects. Specifically, the connection terminal 16 projects from a tip end surface of the projected portion 19a. The internal terminal 15a is disposed along the connection terminal 16 inside the projected portion 19a, as shown in FIGS. 2 and 7. Further, as described above, the internal terminal 15a is exposed from the opening formed on the bottom surface of the projected portion 19a.

It is designed so that the creepage distance between the internal terminal 15a and the connection terminal 16 along the surface of the projected portion 19a is greater than the length that secures the insulation between the internal terminal 15a and the connection terminal 16 when a predetermined effective voltage is applied.

Figure 8:
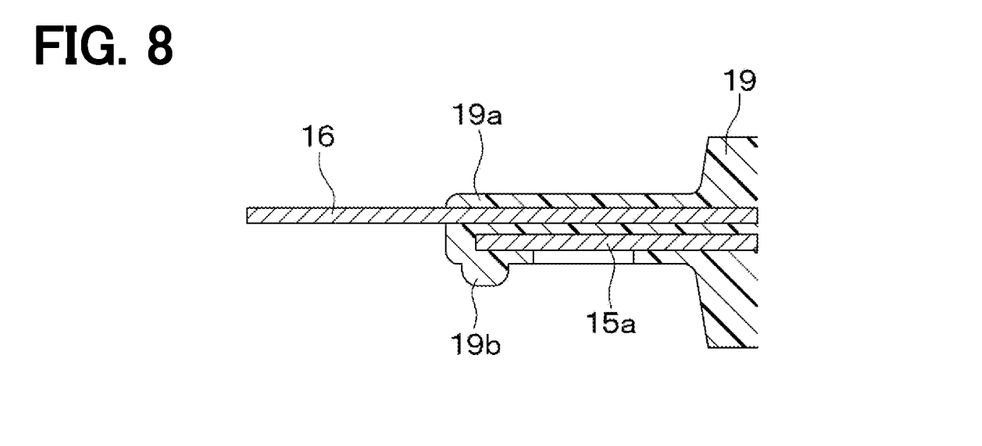
FIG. 8 is a cross-sectional view of a part of the semiconductor module around connection terminals.
Figure 9:
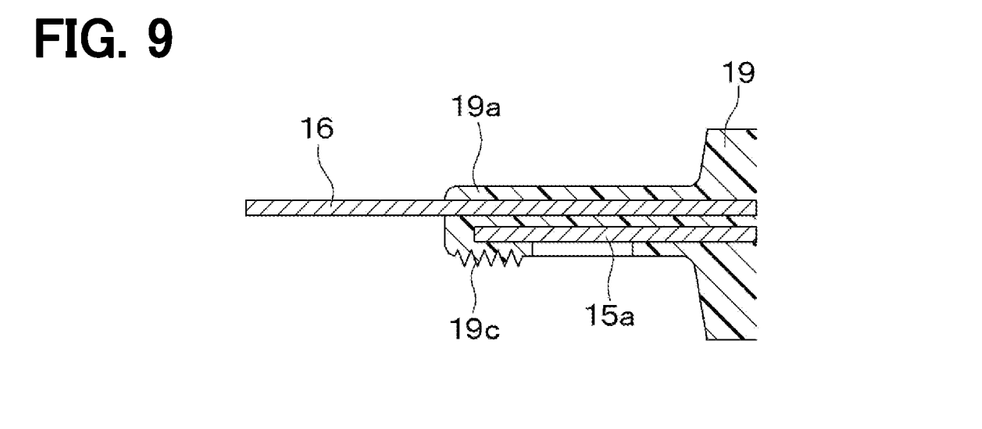
FIG. 9 is a cross-sectional view of a part of the semiconductor module around connection terminals.

In FIG. 7, for example, the bottom surface of the projected portion 19a from which the internal terminal 15a is exposed is a flat surface. As another example, the projected portion 19a may have a protrusion 19b on the bottom surface from which the internal terminal 15a is exposed, as shown in FIG. 8. As further another example, the projected portion 19a may have an uneven or rough portion 19c on the bottom surface from which the internal terminal 15a is exposed, as shown in FIG. 9. As a result, the creepage distance between the internal terminal 15a and the connection terminal 16 can be increased.

The surface of the external terminal 15b, which is orthogonal to the overlapping direction of the internal terminal 15a and the connection terminal 16, has the same shape as the surface of the connection terminal 16 orthogonal to the overlapping direction. Specifically, the tip of the external terminal 15b and the tip of the connection terminal 16 projecting from the projected portion 19a each have a U-shape divided into two portions. The tip of the external terminal 15b and the tip of the connection terminal 16 have the same or substantially the same U-shape. Also, the external terminal 15b and the connection terminal 16 have the same or substantially the same projection length in a projecting direction. That is, the tip of the external terminal 15b and the tip of the connection terminal 16 are at the same or substantially at the same position relative to the tip end surface of the projected portion 19a.

The width of the opening at the tip of each of the external terminal 15b and the connection terminal 16 is larger than the diameters of bolts 21a and 22a, which will be described later. Further, the external terminal 15b and the connection terminal 16 are designed to have a certain length from the base to the opening of the U-shaped tip so as to provide a space for fastening work of nuts 26 and 27 with the bolts 21a and 22a, which will be described later.

On the side surface of the resin molded part 19 opposite to the output terminals 13, the control terminals 14 and the connection terminals 15 and 16 are arranged to have a predetermined distance therebetween in the alignment direction. For example, the distance between the control terminals 14 and the connection terminals 15 and 16 is designed to be larger than a distance that can ensure the insulation between the control terminals 14 and the connection terminals 15 and 16 when a predetermined impulse voltage is applied.

The heat dissipation plates 17 and 18 serve as heat sinks. The heat dissipation plates 17 and 18 are each arranged to have a surface facing the semiconductor chips 10. The semiconductor chips 10 are connected to the heat dissipation plates 17 and 18 via the lead frames 11 and 12, and the surfaces of the heat dissipation plates 17 and 18 opposite to the lead frames 11 and 12 are exposed from the resin molded part 19. As described above, each of the semiconductor chips 10 is interposed between the heat dissipation plates 17 and 18. The semiconductor module 6 is used to drive the load 3 in the state being interposed between cooling devices (not shown) disposed on both sides in the thickness direction, while dissipating heat.

Figure 10:
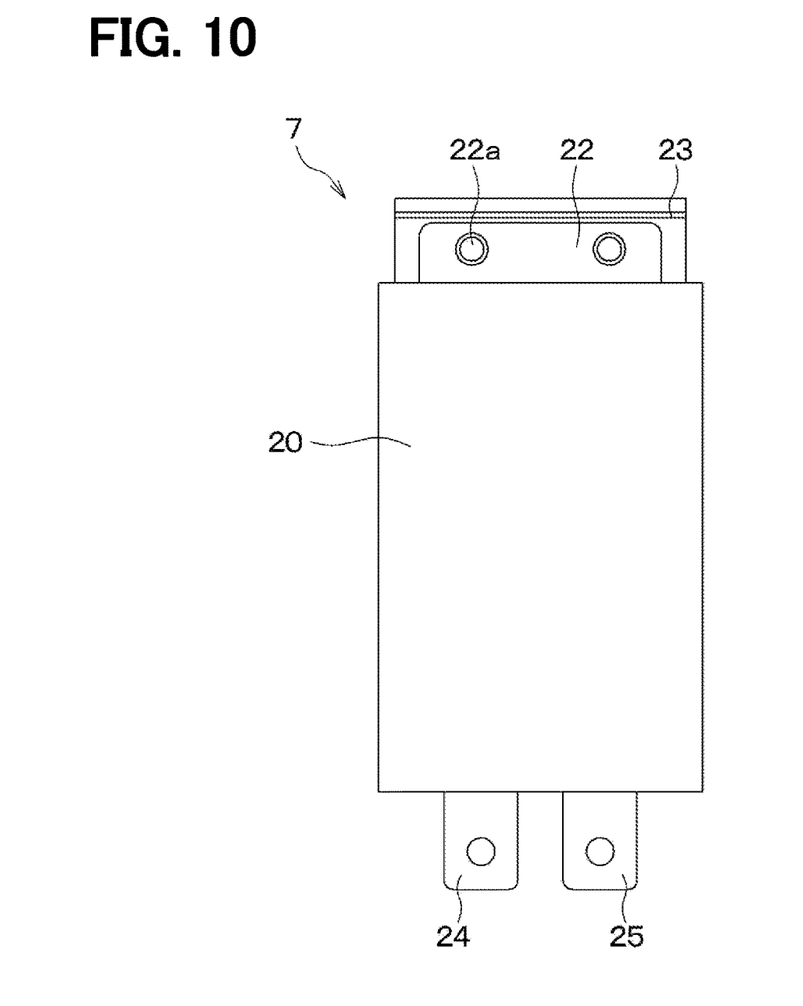
FIG. 10 is a top view of a capacitor module according to the first embodiment of the present disclosure.
Figure 11:
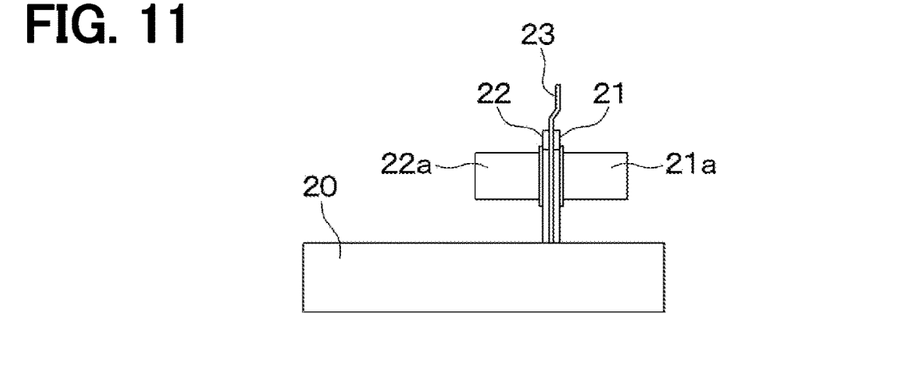
FIG. 11 is a side view of a part of the capacitor module around connection terminals.

The smoothing capacitor 4 is provided in the capacitor module 7 shown in FIGS. 10 and 11. The capacitor module 7 includes a housing 20, the connection terminals 21 and 22, an insulation paper 23, and the connection terminals 24 and 25. The capacitor module 7 corresponds to an electrical component.

The housing 20 is made of a resin. A plurality of the smoothing capacitors 4 are provided inside the housing 20. The connection terminals 21, 22, 24, and 25 are connected to the smoothing capacitors 4 inside the housing 20. The connection terminals 21 and 22 are terminals for connecting the smoothing capacitors 4 to the semiconductor module 6.

The connection terminals 21 and 22 are each provided by a plate-shaped conductive member. The connection terminals 21 and 22 are disposed on top of the other, that is, disposed to overlap with each other, and projected from the housing 20 in an overlapped state. The projecting portion of the connection terminal 21 is connected to the external terminal 15b of the semiconductor module 6, and the projecting portion of the connection terminal 22 is connected to the connection terminal 16. The connection terminal 21 corresponds to a third terminal, and the connection terminal 22 corresponds to a fourth terminal. The overlapping direction of the connection terminals 21 and 22 corresponds to the plate thickness direction of the connection terminals 21 and 22.

The surfaces of the connection terminals 21 and 22 along a direction orthogonal to the overlapping direction have the same or substantially the same shape each other. The connection terminals 21 and 22 have the same or substantially the same projecting lengths from the housing 20. For this reason, it is easy to secure the insulation and to shorten the connection structure, which will be described later, as compared with a configuration in which one of the connection terminals 21 and 22 is longer than the other.

In the projecting portion of the connection terminal 21 from the housing 20, the bolt 21a is formed on the surface opposite to the connection terminal 22. In the projecting portion of the connection terminal 22 from the housing 20, the bolt 22a is formed on the surface opposite to the connection terminal 21. The bolts 21a and 22a are each made of a conductive metal.

Two bolts 21a and 22a are formed corresponding to the two connection terminals 15 and the two connection terminals 16. The connection terminals 21 and 22 are designed to have a certain length from the base to the bolts 21a, 22a so as to provide a space for fastening work of the nuts 26, 27, which will be described later.

The insulating paper 23 is arranged between the connection terminal 21 and the connection terminal 22. The insulating paper 23 is for suppressing contact between the connection terminal 21 and the connection terminal 22 so as to keep electrical insulation. The insulating paper 23 is made of, for example, Nomex (registered trademark). The insulating paper 23 corresponds to an insulating layer.

The insulating paper 23 projects from the housing 20 like the connection terminals 21 and 22. The insulating paper 23 covers the surface of the connection terminals 21 facing the connection terminal 22 and the surface of the connection terminal 22 facing the connection terminal 21. That is, outside of the housing 20, the surface of the projecting portion of the connection terminal 21 and the surface of the projecting portion of the connection terminal 22 entirely face each other through the insulating paper 23 interposed therebetween.

As a result, the creepage distance of the connection terminals 21 and 22 along the insulating paper 23 is twice the projecting length of the insulating paper 23 with respect to the connection terminals 21 and 22. It is designed so that the creepage distance is greater than the length that secures the insulation of the connection terminals 21 and 22 when a predetermined effective voltage is applied. The insulating paper 23 is designed to have the thickness that is greater than the thickness that secures the insulation of the connection terminals 21 and 22 when a predetermined impulse voltage is applied.

As shown in FIG. 11, the tip of the insulating paper 23 is bent so as to have a crank-shape when viewed from the side surface of the housing 20 in order to avoid contact with the connection terminals 15 and 16 of the semiconductor module 6. The connection terminals 15 and 16 may be protected by insulating tape in order to avoid contact with the insulating paper 23.

The connection terminals 24 and 25 project from a side surface of the housing 20 on the opposite side from which the connection terminals 21 and 22 project. The connection terminals 24 and 25 are terminals for connecting the smoothing capacitor 4 to the DC power supply 2. The smoothing capacitor 4 and the respective semiconductor chips 10 are connected to the DC power supply 2 by connecting the connection terminals 21 and 22 to the semiconductor module 6 and connecting the connection terminals 24 and 25 to the DC power supply 2.

The connection structure of the semiconductor module 6 and the capacitor module 7 will be described. The connection structure is configured by connecting the semiconductor module 6 and the capacitor module 7, as shown in FIGS. 12 to 15.

That is, the external terminals 15b and the connection terminals 16 of the semiconductor module 6 are slid relative to the connection terminals 21 and 22 of the capacitor module 7 so that the tips of the external terminals 15b and the tips of the connection terminals 16 come into contact with the bolts 21a and 22a. As a result, as shown in FIG. 14, the connection terminals 21 and 22 and the insulating paper 23 are received between the external terminals 15b and the connection terminals 16.

Figure 12:
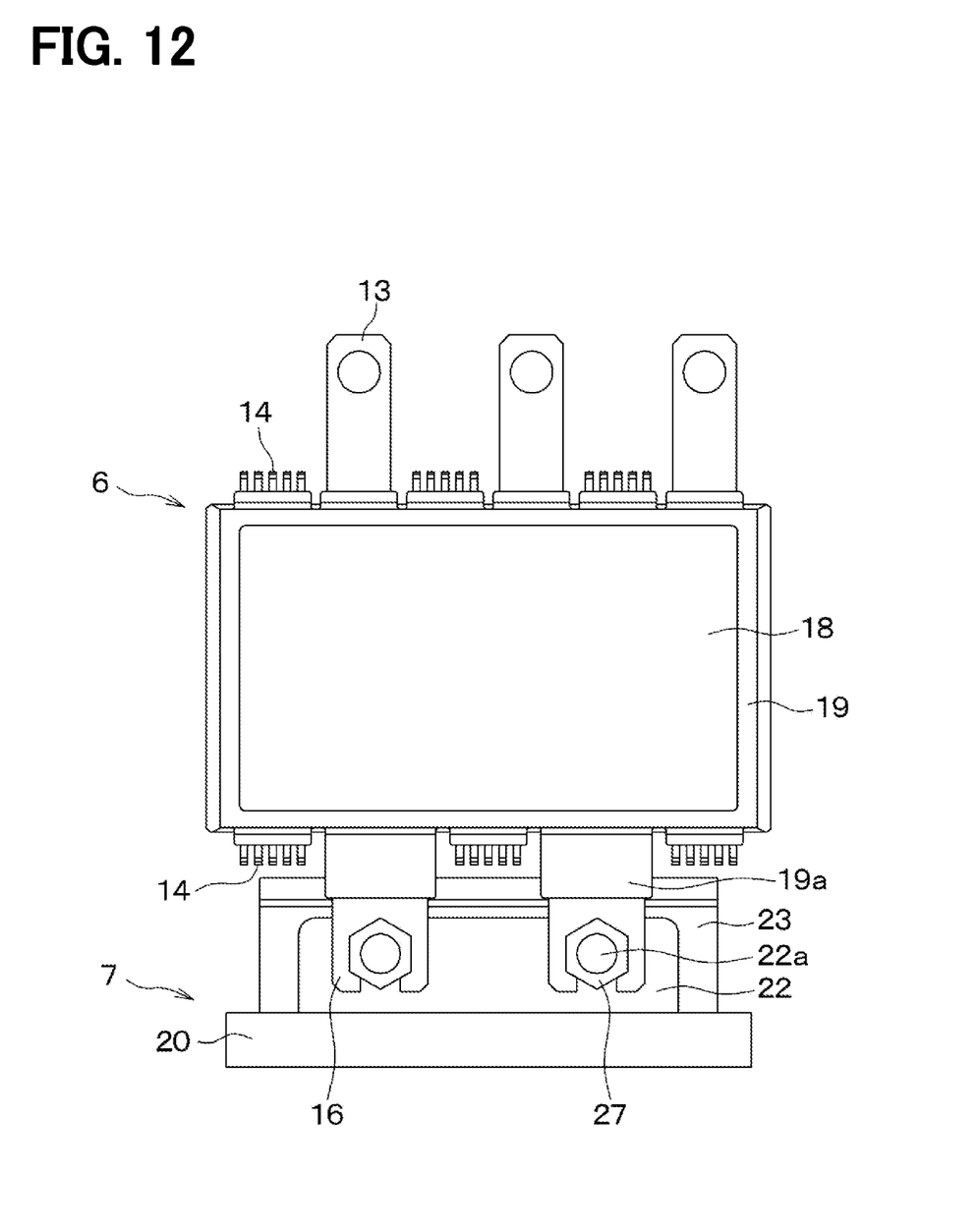
FIG. 12 is a top view of a connection structure of the semiconductor module and the capacitor module.
Figure 13:
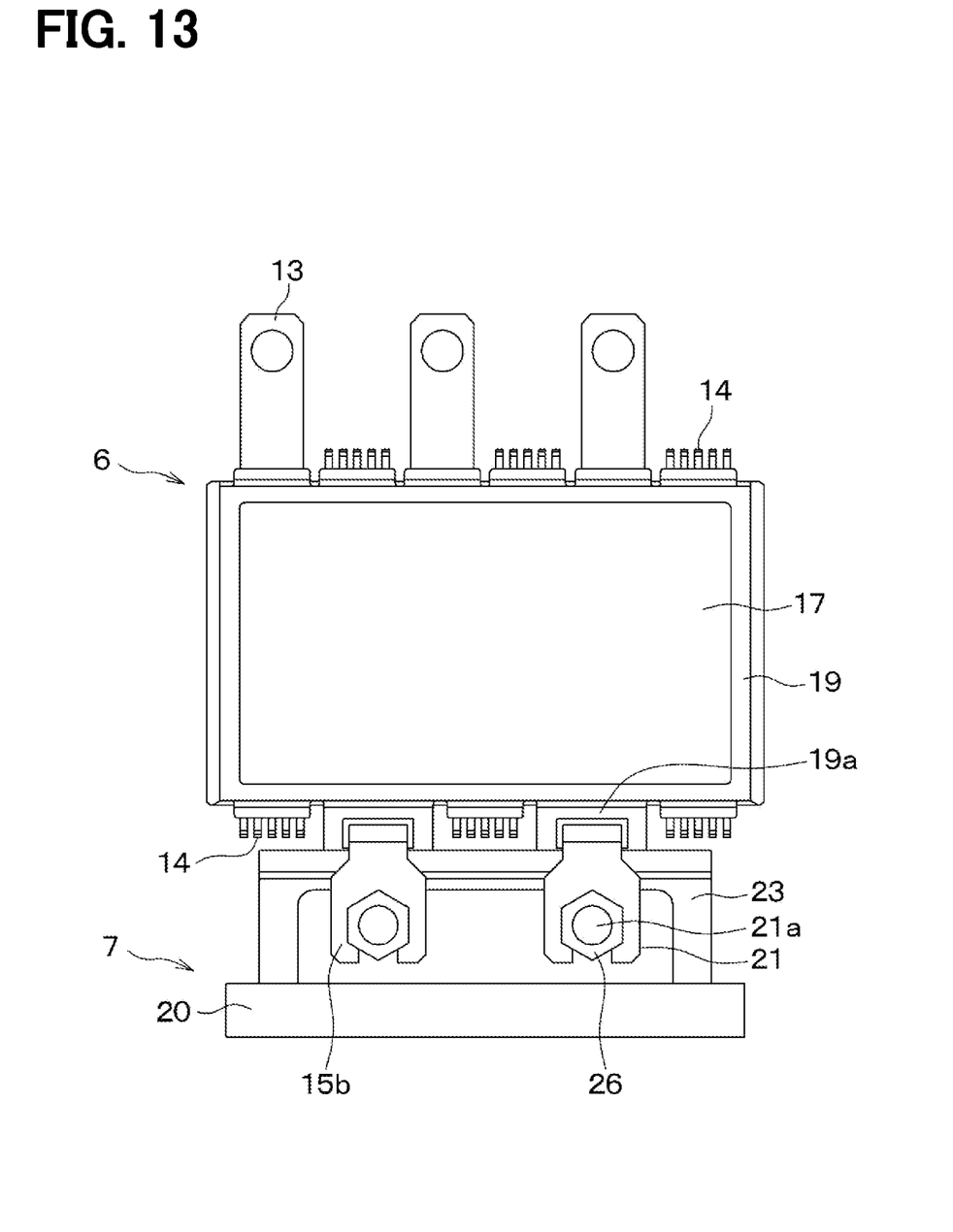
FIG. 13 is a bottom view of the connection structure of the semiconductor module and the capacitor module.
Figure 15:
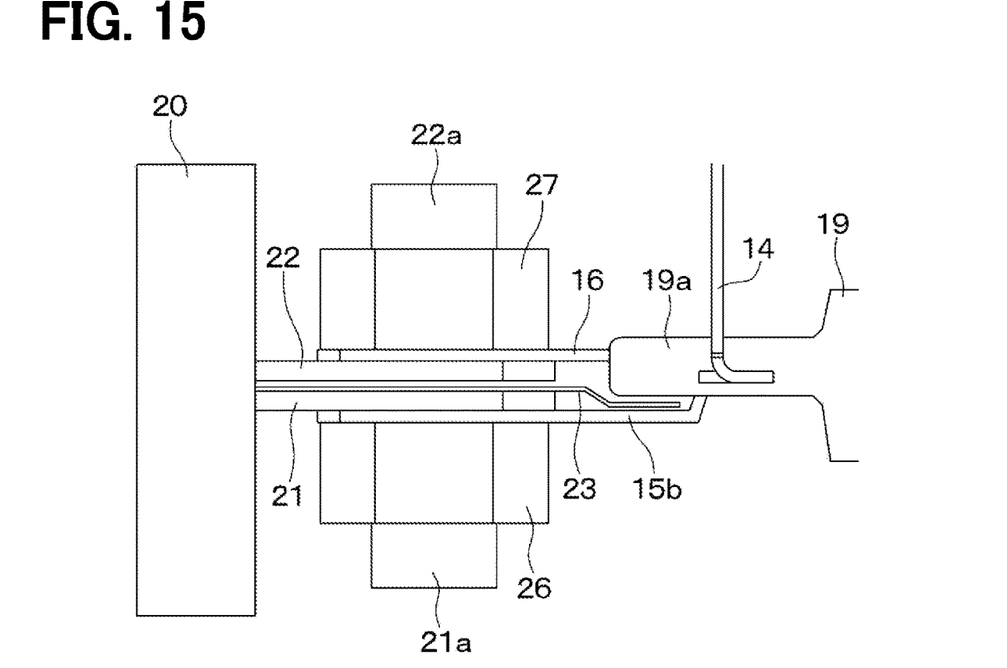
FIG. 15 is a side view of the connection structure after the nuts are fastened thereto.

Then, as shown in FIGS. 12, 13, and 15, the external terminals 15b are connected to the connection terminal 21 by the bolts 21a and the nuts 26. Likewise, the connection terminals 16 are connected to the connection terminal 22 by the bolts 22a and the nuts 27. The nuts 26 and 27 are made of conductive metal.

As described above, the connection structure has a layered structure in which the connection terminals 15 and 16 and the connection terminals 21 and 22 are disposed on top of another in the thickness direction of the connection terminals 15, 16, 21 and 22.

Figure 14:
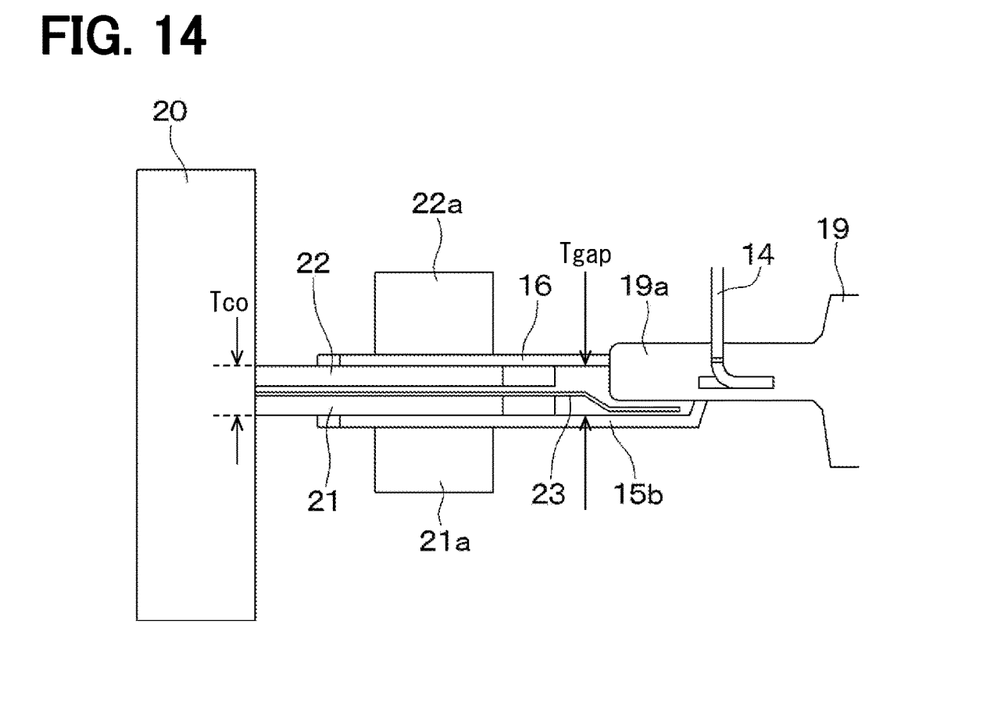
FIG. 14 is a side view of the connection structure before nuts are fastened thereto.

For example, as shown in FIG. 14, a distance between the external terminal 15b and the connection terminal 16 in the thickness direction is referred to as a distance $T_{gap}$, and a distance between an outer surface of the connection terminal 21 opposite to the connection terminal 22 and an outer surface of the connection terminal 22 opposite to the connection terminal 21 in the thickness direction is referred to as a distance $T_{co}$. The distance $T_{gap}$ and the distance $T_{co}$ are designed so that the minimum value of the distance $T_{gap}$ is equal to or greater than the maximum value of the distance $T_{co}$.

As shown in FIG. 15, in the connection structure, a part of the resin molded part 19 or a part of the insulating paper 23 is located on a straight line connecting any point on the external terminal 15b or the connection terminal 21 on a positive side and any point on the connection terminal 16 or the connection terminal 22 on a negative side. Specifically, in a space defined between the connection terminals 21 and 22 and the projected portion 19a, the insulating paper 23 is arranged between the external terminal 15b and the connection terminal 16. Further, a corner portion of the projected portion 19a is arranged between the base portion of the external terminal 15b and the base portion of the connection terminal 16.

As described above, in the semiconductor module 6 of the present embodiment, the connection terminals 15 and 16 each have a plate shape. The connection terminals 15 and 16 are disposed on top of the other, that is, disposed to overlap with each other. The connection terminal 16 projects to the outside of the resin molded part 19, and the internal terminal 15a of the connection terminal 15 is exposed from the surface of the projected portion 19a of the resin molded part 19, the surface being different from the surface from which the connection terminal 16 projects. The surface of the projected portion 19a of the resin molded part 19 from which the internal terminal 15a is exposed will also be referred to as the bottom surface or a first surface. The surface of the projected portion 19a of the resin molded part 19 from which the connection terminal 16 projects will also be referred to as the tip end surface or a second surface.

Since the connection terminals 15 and 16 are overlapped in this way, the wiring inductance can be reduced by magnetic cancellation. Further, since the internal terminal 15a is exposed from the surface of the resin molded part 19, the surface being different from the surface from which the connection terminal 16 projects, it is easy to secure the insulation distance between the internal terminal 15a and the connection terminal 16, for example, as compared with a configuration in which the internal terminal 15a and the connection terminal 16 project from the same surface.

In the capacitor module 7 of the present embodiment, the connection terminals 21 and 22 each have a plate shape. The connection terminals 21 and 22 are disposed on top of the other and projected from the housing 20 in the overlapped state. The connection terminal 21 is formed with the bolt 21a on the surface opposite to the connection terminal 22. The connection terminal 22 is formed with the bolt 22a on the surface opposite to the connection terminal 21.

Since the connection terminals 21 and 22 have such an overlapped structure, the wiring inductance can be reduced by magnetic cancellation. Further, since the connection terminals 21 and 22 have the bolts 21a and 22a as described above, the semiconductor module 6 and the capacitor module 7 can be connected by simply sliding the connection terminals 15 and 16 relative to the connection terminals 21 and 22. As such, the semiconductor module 6 and the capacitor module 7 can be easily connected, and the insulation can be easily secured.

According to the embodiment described above, the following effects will be achieved.

(1) The connection terminals 15 and 16 are covered with the projected portion 19a of the resin molded part 19, and are overlapped with each other at a part covered with the projected portion 19a. Further, the connection terminal 16 projects to the outside of the resin molded part 19 from the surface of the projected portion 19a. The internal terminal 15a of the connection terminal 15 is exposed from the projected portion 19a through the opening that is formed on the surface of the projected portion 19a different from the surface from which the connection terminal 16 projects.

By exposing the internal terminal 15a of the connection terminal 15 through the opening of the projected portion 19a as described above, the insulation distance can be further easily secured. In the case where the projected portion 19a is provided with the protrusion 19b or the rough portion 19c on its bottom surface, the insulation distance can be further easily secured.

In a case where the surface of the resin molded part 19 is covered with a mold release component, deterioration of mechanical characteristics and electrical characteristics due to moisture absorption and adhesion of dirt can be reduced. As such, deterioration of creeping insulation performance can be suppressed. For example, in a case where the resin molded part 19 is formed by transfer molding, the surface of the resin molded part 19 is covered with a mold release component. In this case, the above effect can be achieved without performing a step such as a surface treatment of the projected portion 19a. As such, it is possible to suppress an increase in the manufacturing cost of the semiconductor module 6.

(2) The external terminal 15b is connected to the internal terminal 15a at the opening of the projected portion 19a. Further, the external terminal 15b has the same planar shape as the connection terminal 16. That is, the surface of the external terminal 15b orthogonal to the overlapping direction has the same shape as the surface of the connection terminal 16 orthogonal to the overlapping direction. In other words, the external terminal 15b and the connection terminal 16 have the same projection length relative to the end surface of the projected portion 19a. In such a configuration, it is possible to shorten the length of the connection structure of the semiconductor module 6 and the capacitor module 7, as compared with the case where the projection lengths of the terminals are different. In addition, it becomes easy to secure insulation.

(3) The internal terminal 15a is disposed to overlap on the lead frame 12 to which the connection terminal 16 is connected, at a part covered with the resin molded part 19. In this case, it is possible to reduce the wiring inductance and reduce the thickness dimension of the semiconductor module 6.

(4) The semiconductor module 6 includes the six semiconductor chips 10, the two connection terminals 15 and the two connection terminal 16. The six semiconductor chips 10 are arranged in three rows, and the connection terminals 15 and 16 are arranged so as to interpose therebetween the semiconductor chips 103 and 104 arranged in the central row of the three rows.

(5) Since the connection terminals 15 and 16 are pulled out, that is, extended in parallel, the wiring inductance can be reduced. Three or more sets of connection terminals may be pulled out in parallel. The larger the number of sets of the connection terminals to be pulled out is, the greater the effect of reducing the wiring inductance is. However, in the case where the number of the sets of connection terminals to be pulled out is two, the wiring inductance can be reduced as well as the increase in size of the semiconductor module 6 can be suppressed.

(6) The surface of the connection terminal 21 facing the connection terminal 22 and the surface of the connection terminal 22 facing the connection terminal 21 are covered with the insulating paper 23. In such a configuration, since the electrical insulation of the connection terminals 21 and 22 is ensured by the creepage distance of the insulating paper 23, the length of the connection structure between the semiconductor module 6 and the capacitor module 7 can be shortened.

(7) In the connection structure between the semiconductor module 6 and the capacitor module 7, the connection terminals 15, 16, 21, and 22 are disposed on top of another. In such a configuration, the load caused at the time of bolt-fastening is received by the four terminals, deformation of the terminals and poor contact can be suppressed.

(8) A part of the resin molded part 19 or a part of the insulating paper 23 is arranged on a straight line connecting a point on the connection terminal 15 or the connection terminal 21 on a positive side, and a point on the connection terminal 16 or the connection terminal 22 on a negative side. In such a configuration, the size of the connection structure is kept small, and the insulation can be easily secured.

(9) The external terminal 15b and the connection terminal 16 are connected to the connection terminal 21 and the connection terminal 22 by bolts 21a and 22a and nuts 26 and 27 made of conductive metal, respectively. By using the bolts 21a and 22a and the nuts 26 and 27 made of metal, strong connection and pressure welding are possible, and the connection between terminals becomes stable.

Other Embodiments

The present disclosure is not limited to the embodiment described above, and can be modified in various other ways. Individual components or features of the embodiment described above are not necessarily essential unless it is specifically stated that the components or the features are essential in the foregoing description, or unless the components or the features are obviously essential in principle. The numerical value such as the number, the numerical value, the quantity, the range, or the like of components mentioned in the embodiment described above is not limited to a specific number unless specified as being required, clearly limited to such a specific number in principle, or the like. The shape, the positional relationship, and the like of a component or the like mentioned in the embodiment described above are not limited to those being mentioned unless otherwise specified, limited to specific shape, positional relationship, and the like in principle, or the like.

The present disclosure may be applied to a semiconductor module constituting any circuit, other than the three-phase inverter circuit. Further, the present disclosure may be applied to electrical components other than the capacitor module.

The connection terminals 15 may be connected to the semiconductor chips 102, 104, 106 of the lower arms, and the connection terminals 16 may be connected to the semiconductor chips 101, 103, 105 of the upper arms. In this case, for example, the semiconductor chips 101, 103, 105 of the upper arms are mounted on the back surface of the lead frame 12, and the semiconductor chips 102, 104, 106 of the lower arms are mounted on the front surface of the lead frame 11. Further, the connection terminal 16 may be disposed to overlap with the lead frame 11 to which the connection terminal 15 is connected at the part covered with the resin molded part 19.

What is claimed is:

1. A semiconductor module comprising:
a resin molded part encapsulating a semiconductor chip;
a first terminal having a plate shape; and
a second terminal having a plate shape, wherein
the first terminal and the second terminal are disposed to overlap with each other in a thickness direction of the first terminal and the second terminal,
the first terminal is exposed from a first surface of the resin molded part, and
the second terminal is projected from a second surface of the resin molded part to an outside of the resin molded part, the second surface being different from the first surface from which the first terminal is exposed.

2. The semiconductor module according to claim 1, wherein the resin molded part has a projected portion, the first terminal and the second terminal are covered with the projected portion and overlapped with each other inside the projected portion, the second surface from which the second terminal is projected is included in the projected portion, the first surface from which the first terminal is exposed is included in the projected portion, and the first surface has an opening and the first terminal is exposed on the first surface through the opening.

3. The semiconductor module according to claim 2, wherein the first terminal includes an internal terminal and an external terminal, the internal terminal is covered with the resin molded part and exposed on the first surface through the opening, the external terminal is joined to the internal terminal through the opening on the first surface, and the external terminal has a surface that has a same shape as a surface of the second terminal, the surface of the external terminal and the surface of the second terminal being orthogonal to the thickness direction of the first terminal and the second terminal.

4. The semiconductor module according to claim 1, wherein the second terminal is connected to a lead frame inside the resin molded part, and the first terminal is overlapped with the lead frame in a region covered with the resin molded part.

5. The semiconductor module according to claim 1, wherein the first terminal is connected to a lead frame inside the resin molded part, and the second terminal is overlapped with the lead frame in a region covered with the resin molded part.

6. The semiconductor module according to claim 1, wherein the first terminal is one of two first terminals, and the second terminal is one of two second terminals.

7. The semiconductor module according to claim 6, wherein the semiconductor chip is one of six semiconductor chips, the six semiconductor chips are arranged into three rows including a first row, a second row and a central row between the first row and the second row, the two first terminals are disposed on opposite sides of the semiconductor chips on the central row, and the two second terminals are disposed on opposite sides of the semiconductor chips on the central row.

8. An electrical component comprising:

a housing;

a third terminal having a plate shape; and a fourth terminal having a plate shape, wherein the third terminal and the fourth terminal are disposed to overlap with each other in a thickness direction of the third terminal and the fourth terminal, and projected from the housing in an overlapped state, the third terminal has a first bolt on a surface opposite to the fourth terminal, and the fourth terminal has a second bolt on a surface opposite to the third terminal.

9. The electrical component according to claim 8, further comprising:

an insulating layer disposed between the third terminal and the fourth terminal, and a surface of the third terminal facing the fourth terminal and a surface of the fourth terminal facing the third terminal are covered with the insulating layer.

10. A connection structure comprising;

a semiconductor module;

and an electrical component, wherein the semiconductor module includes a resin molded part encapsulating a semiconductor chip, a first terminal having a plate shape, and a second terminal having a plate shape;

the first terminal and the second terminal are disposed to overlap with each other in a thickness direction of the first terminal and the second terminal;

the first terminal is exposed from a first surface of the resin molded part;

the second terminal is projected from a second surface of the resin molded part to an outside of the resin molded part, the second surface being different from the first surface from which the first terminal is exposed;

the electrical component includes a housing, a third terminal having a plate shape, and a fourth terminal having a plate shape;

the third terminal and the fourth terminal are disposed to overlap with each other in a thickness direction of the third terminal and the fourth terminal, and projected from the housing in an overlapped state;

the third terminal has a first bolt on a surface opposite to the fourth terminal;

the fourth terminal has a second bolt on a surface opposite to the third terminal;

and the first terminal, the second terminal, the third terminal and the fourth terminal are disposed to overlap with each other in the thickness direction.

11. The connection structure according to claim 10, wherein the electronic component further includes an insulating layer disposed between the third terminal and the fourth terminal, the first terminal is connected to the third terminal, the second terminal is connected to the fourth terminal, and a part of the resin molded part or a part of the insulating layer is disposed on a straight line connecting a point on the first terminal or the third terminal, and a point on the second terminal or the fourth terminal.

12. The connection structure according to claim 10, wherein the first terminal and the second terminal of the semiconductor module are connected to the third terminal and the fourth terminal of the electrical component, respectively, with the first bolt and the second bolt and nuts made of conductive metal.

* * * * *